(12) United States Patent
Lee et al.

(10) Patent No.: US 11,410,949 B2
(45) Date of Patent: Aug. 9, 2022

(54) MEMORY DEVICES WITH BACKSIDE BOND PADS UNDER A MEMORY ARRAY

(71) Applicant: Micron Technology, Inc., Boise, ID (US)

(72) Inventors: Eric N. Lee, San Jose, CA (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 16/940,040

(22) Filed: Jul. 27, 2020

(65) Prior Publication Data

US 2022/0028808 A1    Jan. 27, 2022

(51) Int. Cl.

| | |
|---|---|
| *H01L 23/00* | (2006.01) |
| *H01L 25/18* | (2006.01) |
| *H01L 23/48* | (2006.01) |
| *H01L 21/48* | (2006.01) |
| *H01L 27/11519* | (2017.01) |
| *H01L 27/11529* | (2017.01) |
| *H01L 27/1157* | (2017.01) |
| *H01L 27/11565* | (2017.01) |
| *H01L 27/11573* | (2017.01) |
| *H01L 27/11524* | (2017.01) |

(52) U.S. Cl.
CPC .......... *H01L 24/05* (2013.01); *H01L 21/4814* (2013.01); *H01L 23/481* (2013.01); *H01L 24/03* (2013.01); *H01L 25/18* (2013.01); *H01L 27/1157* (2013.01); *H01L 27/11519* (2013.01); *H01L 27/11524* (2013.01); *H01L 27/11529* (2013.01); *H01L 27/11565* (2013.01); *H01L 27/11573* (2013.01); *H01L 2224/05025* (2013.01); *H01L 2924/13091* (2013.01); *H01L 2924/1438* (2013.01)

(58) Field of Classification Search
CPC ... H01L 24/05; H01L 21/4814; H01L 23/481; H01L 24/03; H01L 25/18; H01L 27/11519; H01L 27/11524; H01L 27/11529; H01L 27/11565; H01L 27/1157; H01L 27/11573; H01L 2224/05025; H01L 2924/13091; H01L 2924/1438
See application file for complete search history.

(56) References Cited

U.S. PATENT DOCUMENTS

| | | | |
|---|---|---|---|
| 11,081,167 B1* | 8/2021 | Yabe | G11C 16/26 |
| 11,081,474 B1* | 8/2021 | Hoang | G11C 16/3459 |
| 2011/0074014 A1* | 3/2011 | Pagaila | H01L 23/5389 257/737 |
| 2014/0264235 A1* | 9/2014 | Gong | H01L 23/49822 257/4 |
| 2019/0304978 A1* | 10/2019 | Wang | H01L 27/0688 |
| 2020/0381397 A1* | 12/2020 | Yu | H01L 25/50 |

* cited by examiner

Primary Examiner — Mamadou L Diallo
(74) Attorney, Agent, or Firm — Perkins Coie LLP (57) ABSTRACT

An apparatus is provided, comprising a substrate with a frontside and a backside opposite the frontside; control circuitry disposed over the frontside of the substrate; a memory array disposed over and electrically coupled to the control circuitry; a through-silicon via (TSV) disposed under the memory array, the TSV extending through the substrate from the control circuitry to the backside of the substrate; and a bond pad disposed on the backside of the substrate and electrically coupled to the control circuitry via the TSV.

17 Claims, 12 Drawing Sheets

MEMORY DEVICES WITH BACKSIDE BOND PADS UNDER A MEMORY ARRAY

TECHNICAL FIELD

The present disclosure generally relates to memory devices, and more specifically, relates to memory devices with backside bond pads under a memory array.

BACKGROUND

Memory devices, such as NAND devices, include an array of memory cells and control circuitry (e.g., implemented as complementary metal-oxide-semiconductor (CMOS circuitry) formed on an active surface of a semiconductor (e.g., silicon) substrate. Such memory devices can include bond pads through which control and data signals are provided to and from the memory device.

BRIEF DESCRIPTION OF THE DRAWINGS

The present disclosure will be understood more fully from the detailed description given below and from the accompanying drawings of various embodiments of the disclosure.

DETAILED DESCRIPTION

Memory devices can include different combinations and types of non-volatile memory components and/or volatile memory components. An example of non-volatile memory components is a negative-and (NAND) type flash memory. The memory components can include one or more arrays of memory cells such as single-level cells (SLCs) or multi-level cells (MLCs) (e.g., triple-level cells (TLCs) or quad-level cells (QLCs)). In some embodiments, a particular memory component can include both an SLC portion and an MLC portion of memory cells. Each of the memory cells can store one or more bits of data (e.g., data blocks). A memory device can further include control circuitry, such as CMOS circuitry, that provides control and data signals for the memory array and that interfaces the memory device with external components. An example control circuitry is a CMOS under array (CUA) design, where the CMOS is located between the memory array and a substrate. In some cases, a memory device can be a memory die, e.g., a device fabricated, typically with many other devices, on part of a silicon or other semiconductor substrate, with the control circuitry and a memory array. For example, multiple memory devices, each with control circuitry and a memory array can be formed on a single wafer and a singulation ("dicing") process can split the wafer (e.g., by scribing and breaking, mechanical sawing, laser cutting, etc.) to separate the individual memory devices.

Aspects of the present disclosure are directed to memory dies with a reduced footprint and low-stress bond pad connections. This can be achieved in memory dies by locating the bond pad for each memory die on a backside of the memory die's silicon substrate, with a through-silicon via (TSV) electrically connecting the bond pad to the CMOS control circuitry, which is in disposed under the memory array. This assembly of memory dies does not require extra wafer space for the bond pad outside the footprint of the array, and prevents stress on the memory array that can occur if the bond pad were on a front side of the device over or proximate to the memory array.

Figure 1A:
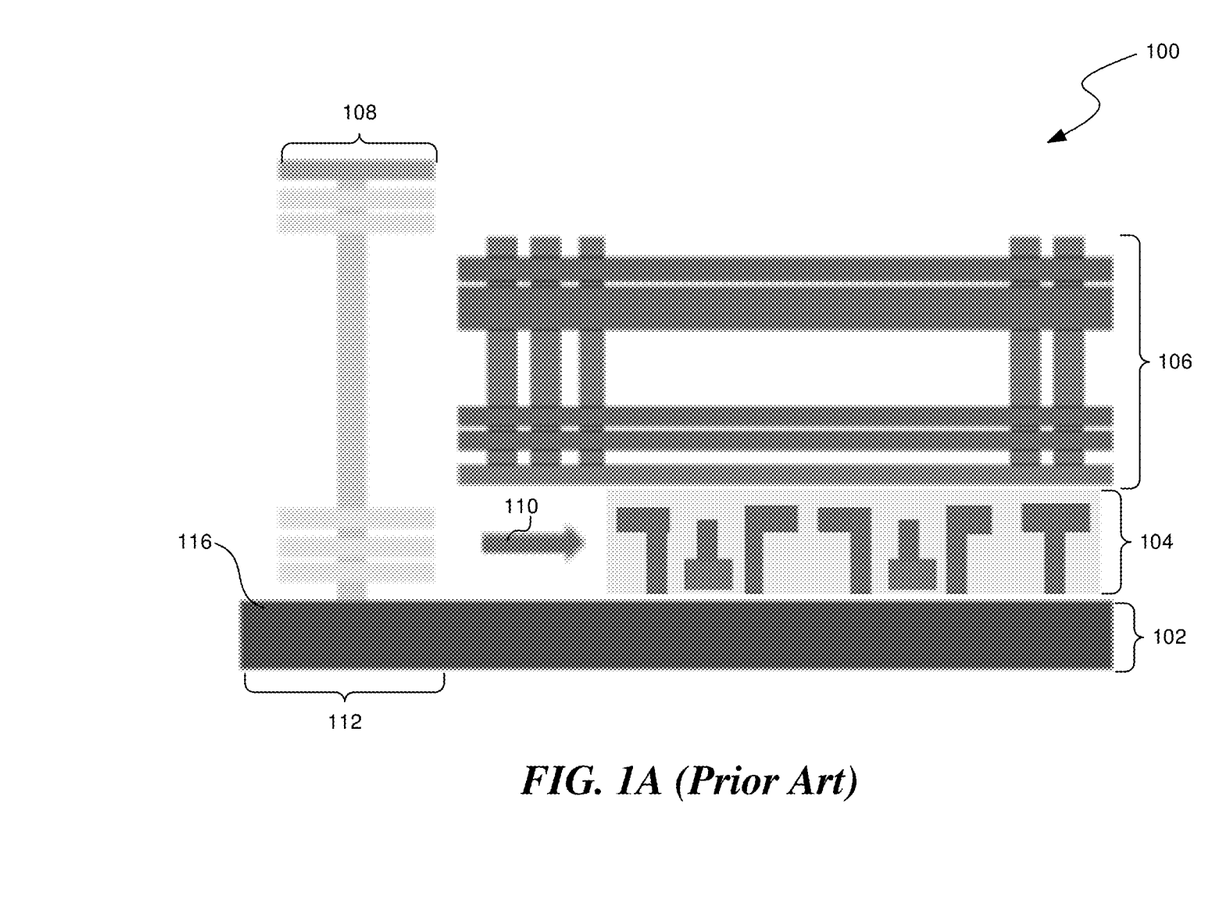
FIGS. 1A and 1B are block diagrams illustrating a memory device in which a bond pad is located on a frontside of a substrate outside and proximate to a memory array of the memory die.
Figure 1B:
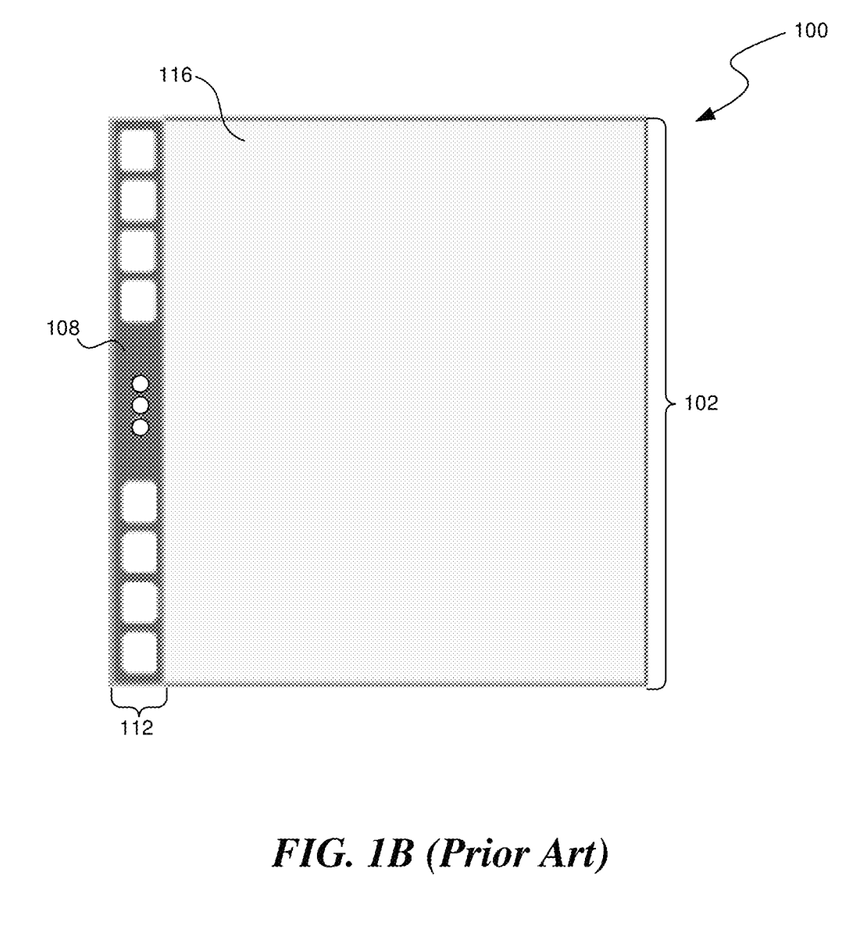
Figure 2A:
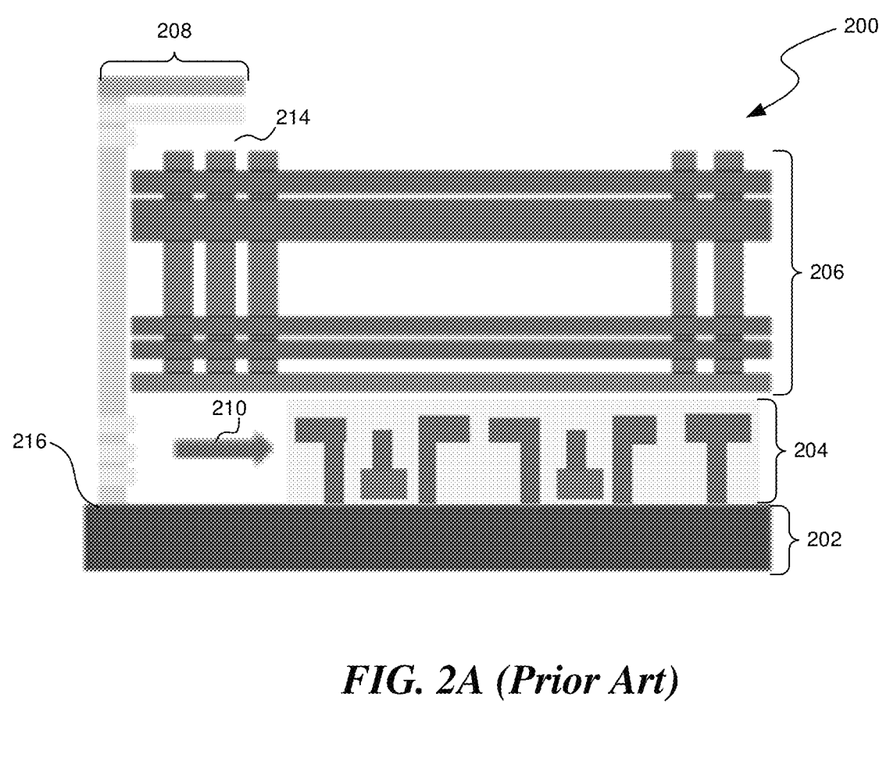
FIGS. 2A and 2B are block diagrams illustrating a memory device in which a bond pad is located on the frontside of the substrate over a memory array of the memory die.
Figure 2B:
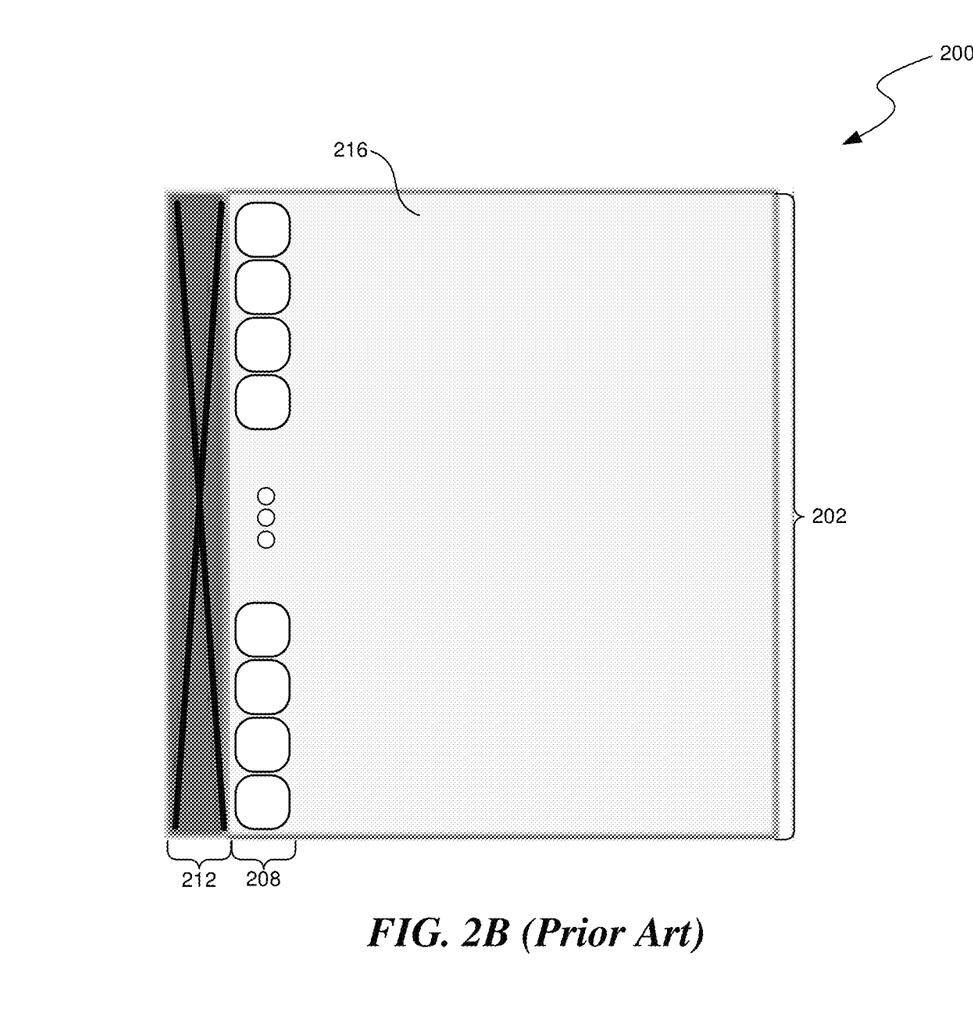

This is contrary to conventional approaches where the bond pad is on the frontside of the memory device, either proximate to the memory array or above it. FIGS. 1A and 1B are block diagrams illustrating a prior art memory die 100, in which a bond pad is located on a frontside 116 of a substrate 102 outside and proximate to a memory array 106 of the memory die 100. The side view of memory die 100 in FIG. 1A illustrates the substrate 102, control circuitry 104 on the frontside 116 of the substrate 102, the memory array 106 over the control circuitry 104, and a bond pad 108, which is connected to the control circuitry 104 through connection 110. The bond pad 108 is placed on the frontside 116 of the substrate 102, taking up area 112 of the substrate 102. The top view of the memory die 100 in FIG. 1B illustrates the frontside 116 of the substrate 102, with area 112 of the substrate 102 taken up by the bond pad 108. FIGS. 2A and 2B are block diagrams illustrating another prior art memory die 200, in which a bond pad 208 is located on a frontside 216 of a substrate 202 over a memory array 206 of the memory die 200. The side view of the memory die 200 in FIG. 2A illustrates the substrate 202, control circuitry 204, the memory array 206 over the control circuitry 204, and a bond pad 208 which is connected to the control circuitry 204 through connection 210. The bond pad 208 is placed over the memory array 206 on the frontside 216 of the substrate 202, which can cause stress on the memory array 206 at point 214 (e.g., when a connection is formed between an external component and the bond pad 208). The top view of the memory die 200 in FIG. 2B illustrates the frontside 216 of the substrate 202, with area 212, which would have been taken up by the bond pad 108 in the configuration of FIGS. 1A and 1B, not taken up by the bond pad 208. Instead, the bond pad 208 is over the memory array 206, exposing the memory array 206 to potential stress and damage.

Figure 3A:
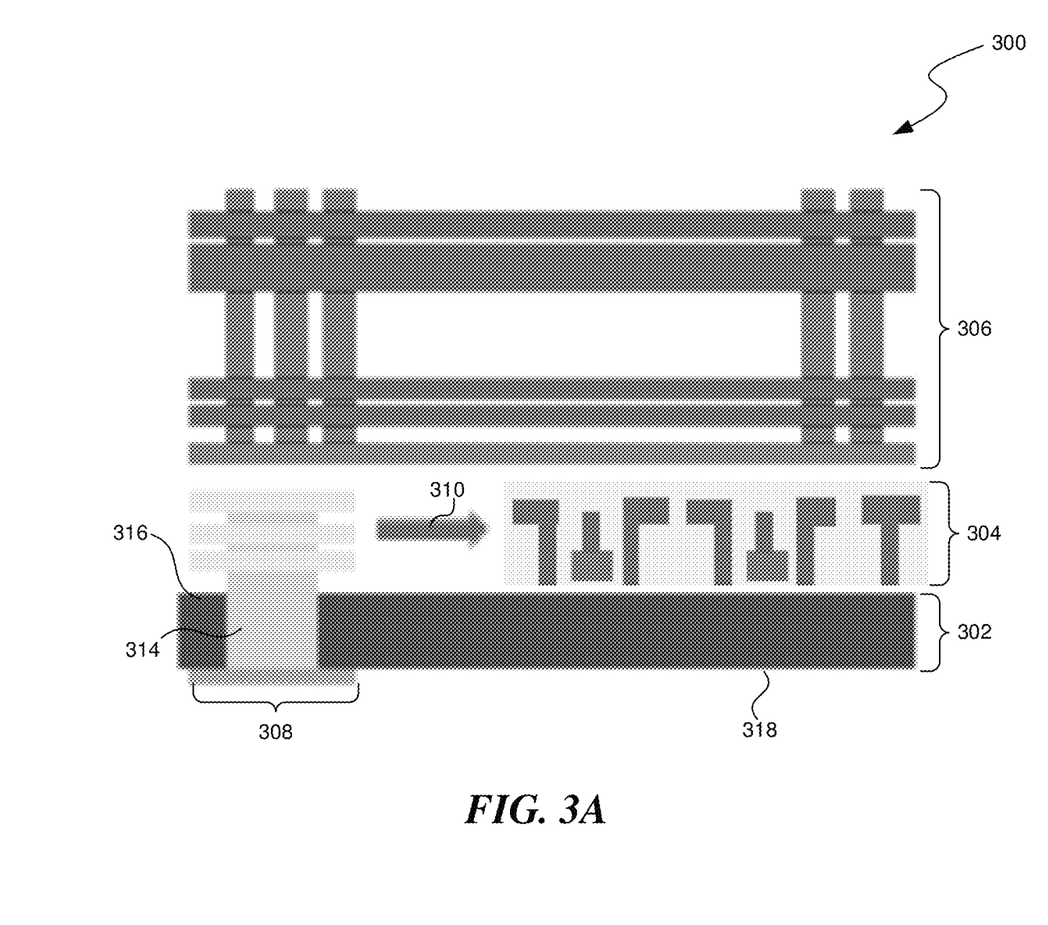
FIGS. 3A, 3B, and 3C are block diagrams illustrating a memory device in which a bond pad is located on a backside of a substrate, connected to control circuitry of the memory die through a TSV in accordance with some embodiments of the present disclosure.
Figure 3B:
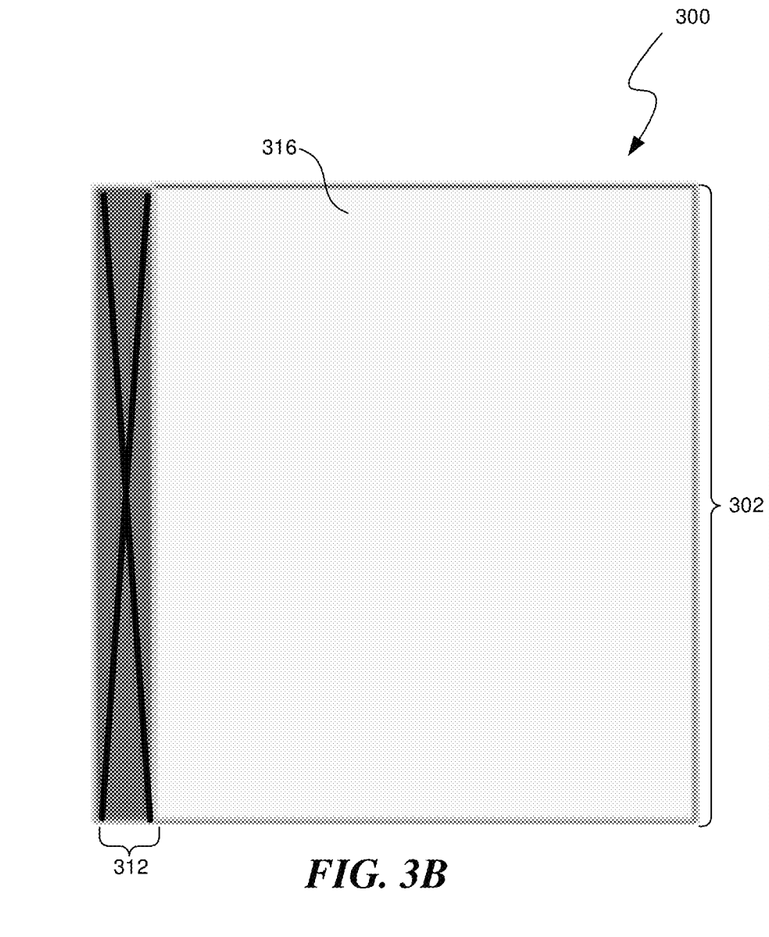
Figure 3C:
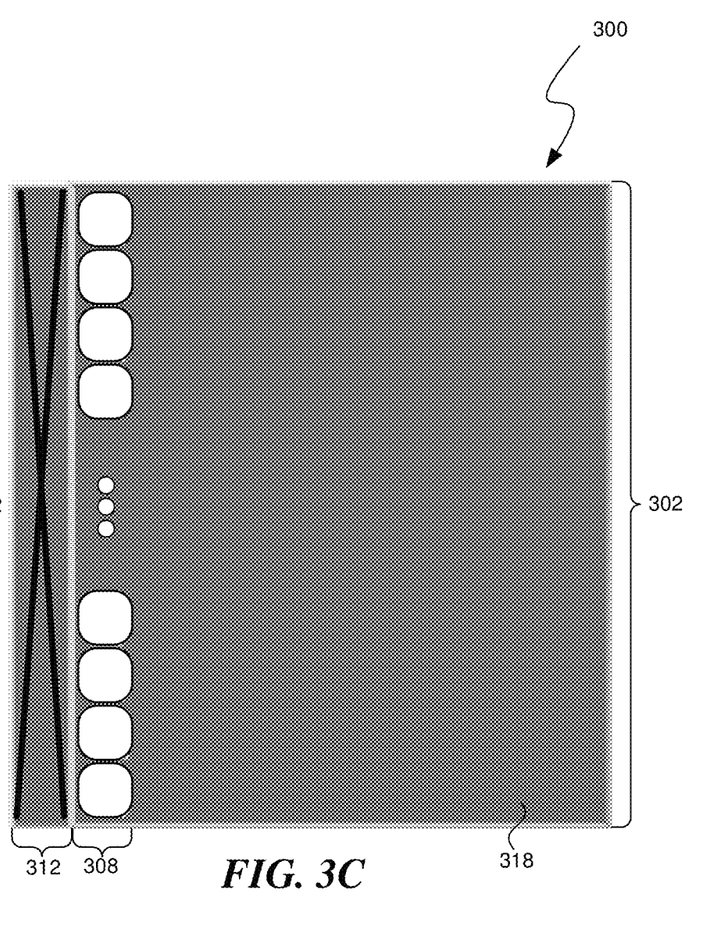

FIGS. 3A, 3B, and 3C are block diagrams illustrating a memory die 300 with a bond pad 308 on a backside 318 of a substrate 302. The side view of the memory die 300 in FIG. 3A illustrates the substrate 302 (with a frontside 316 and a backside 318), control circuitry 304, a memory array 306 over the control circuitry 304, and the bond pad 308 on the backside 318 of the substrate 302.

In some implementations, the control circuitry 304 can be complementary metal-oxide-semiconductor ("CMOS") circuitry. As will be readily apparent to one skilled in the art, the control circuitry 304 can receive instructions from a host system and can communicate with the memory array 306, such as to transfer commands and data to (e.g., write or erase) or transfer data from (e.g., read) one or more of the memory cells, planes, sub-blocks, blocks, or pages of the memory array. The control circuitry 304 can include, among other things, memory control units, circuits, firmware, integrated circuits, or other components configured to control access across the memory array 306 and to provide a translation layer between the host and the memory die 300. In some implementations, the control circuitry 304 can include a row decoder and a column decoder to decode address signals. Address signals are received and decoded to access memory array 306. Input/output (I/O) signals (e.g., commands, addresses, or data) can be provided to control circuitry 304 through TSV 314 and connection 310. Similarly, control circuitry 304 can output data and status information from the memory die 300 through TSV 314 and connection 310. Control circuitry 304 can include an address register, used in conjunction with the row decoder and column decoder, to latch the address signals prior to decoding. Control circuitry 304 can include a command register and control logic to latch incoming commands and control operation of the memory die 300 (e.g., controlling access to the memory array 306 in response to the commands and generating status information for an external processor). Control circuitry 304 can also include (or be in communication with) a cache register that latches data, either incoming or outgoing, to temporarily store data while the memory array 306 is busy writing or reading other data. The control circuitry 304 can also include a data register. During a write operation, data can be passed from the cache register to the data register for transfer to the memory array 306; allowing new data to be latched in the cache register. During a read operation, control circuitry 304 can pass data through the cache register for output to the external processor; allowing new data to be passed from the data register to the cache register.

The memory array 306 can include various memory configurations such as 2D or 3D memory arrays. As will be readily apparent to one skilled in the art, memory array 306 can include memory cells arranged in rows and columns along with access lines (e.g., wordlines) and data lines (e.g., bitlines). The access lines and data lines may be used to transfer information to and from the memory cells. A row decoder and a column decoder can decode address signals on address lines to determine which ones of the memory cells are to be accessed. A sense amplifier circuit can operate to determine the values of information read from the memory cells. Two-dimensional (2D) memory arrays are structures arranged on a surface of a semiconductor substrate. In other implementations, three-dimensional (3D) memory arrays can be employed, which can include strings of storage cells that extend vertically, through multiple vertically spaced tiers containing respective word lines. A semiconductor structure (e.g., a polysilicon structure) can extend adjacent a string of storage cells to form a channel for the cells of the string. In some cases, the polysilicon structure can be in the form of a vertically extending pillar. In other cases, the string can be "folded," and thus arranged relative to a U-shaped pillar. In yet other cases, multiple vertical structures can be stacked upon one another to form stacked arrays of storage cell strings.

The bond pad 308 is connected to the control circuitry 304 of the memory die 300 through a TSV 314 and connection 310. The top view of the memory die 300 in FIG. 3B illustrates the frontside 316 of the substrate 302, with area 312, which would have been taken up by the bond pad 108 in the configuration of FIGS. 1A and 1B, not taken up by the bond pad 308. This provides a smaller overall die footprint for memory die 300 than memory die 100. Thus, in memory die 300, the memory array 306 extends to each edge of the substrate 302 (or within a threshold distance of each edge of the substrate 302) such that there is not enough room between the memory array 306 and an edge of the substrate 302 to form a bond pad on a frontside 316 thereof without overlapping the memory array 306. As illustrated in the bottom view of the memory die 300 in FIG. 3C, the bond pad 308 is on the backside 318 of the substrate 302, allowing the substrate 302 to protect the memory array 306 and the control circuitry 304 from potential stress and damage (e.g., associated with a bonding operation in which an interconnect is formed or brought into contact with the bond pad 308). In addition, there are no bond pads on the frontside of the memory die 300. This provides a more stable and durable memory die 300 as compared to memory die 200.

Although in the present example embodiment, a memory device is illustrated with a single bond pad connected to the control circuitry by a single TSV, in other embodiments of the present disclosure memory devices can include multiple bond pads, each connected by a corresponding one of multiple TSVs, as will be readily apparent to one of skill in the art.

Figure 4:
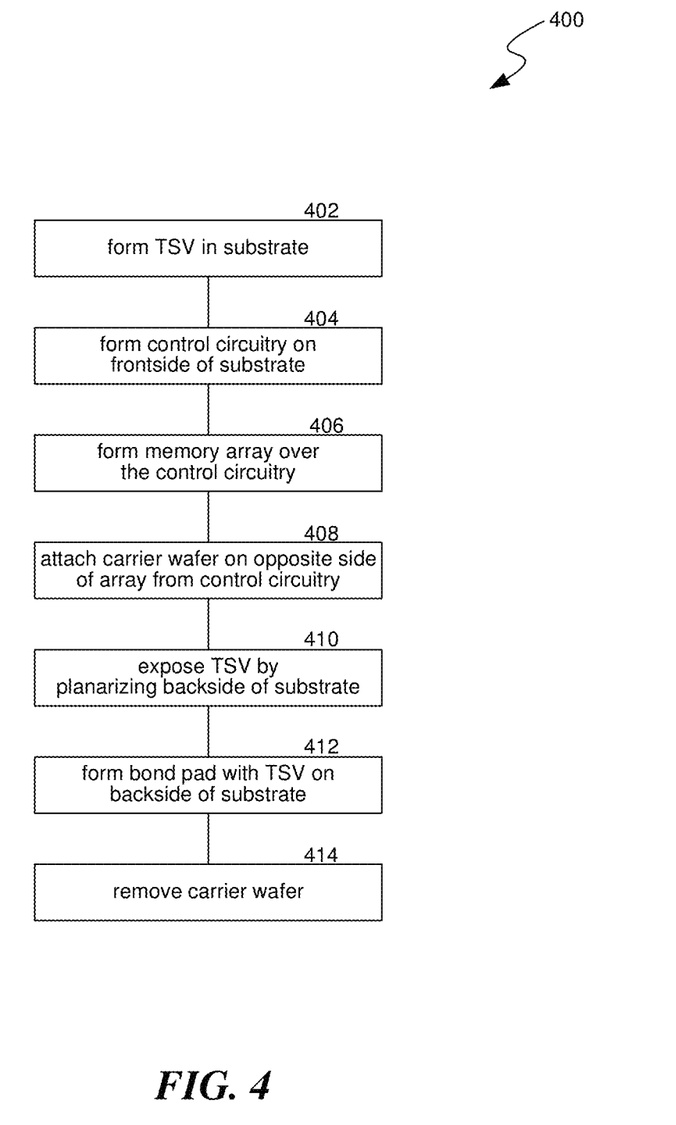
FIG. 4 is a flow diagram of one manufacturing processes for the memory die of FIG. 3, in accordance with some embodiments of the present disclosure.

FIG. 4 is a flow diagram illustrating an example of first manufacturing processes 400 for the memory die 300 in accordance with some implementations of the present technology. Although shown in a particular sequence or order, unless otherwise specified, the order of the processes 400 can be modified. Thus, the illustrated embodiments should be understood only as examples, and the illustrated processes 400 can be performed in a different order, and some of the processes 400 can be performed in parallel. Additionally, one or more of the processes 400 can be omitted in various embodiments. Thus, not all of processes 400 are required in every embodiment. Other process flows are possible. FIGS. 5A-5E are conceptual diagrams 500 illustrating the first manufacturing processes 400 of FIG. 4. While FIGS. 5A-5E show formation of a single memory device, it will be understood that in some cases many such memory devices can be formed on a single wafer before the wafer is singulated to form individual memory die.

Figure 5A:
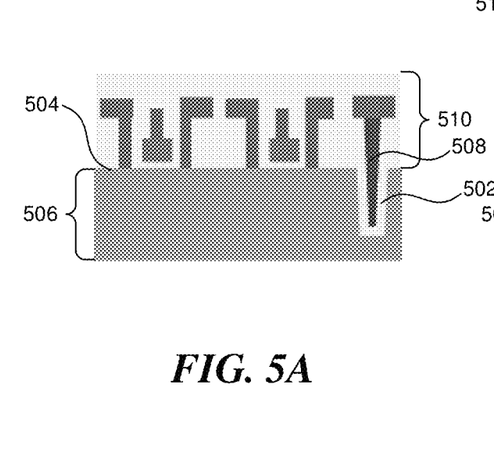
FIGS. 5A-5E are conceptual diagrams illustrating the manufacturing processes of FIG. 4, in accordance with some embodiments of the present disclosure.

At block 402, processes 400 can form a TSV (such as TSV 314) in a substrate 506 (e.g., a semiconductor substrate such as silicon, silicon germanium, etc.). This TSV can be placed to connect to control circuitry of the memory die. In various implementations, a cavity in the substrate, in which processes 400 will form the TSV, can be created using etching or other methods of forming or removing the semiconductor material. As illustrated in FIG. 5A, a cavity 502 is formed by etching the frontside 504 of the substrate. A TSV 508 can be formed in the cavity 502. At block 404, processes 400 can form control circuitry (such as CMOS control circuitry 304) on the frontside of the substrate. As further illustrated in FIG. 5A, control circuitry 510 is formed on the frontside 504 of the substrate 506, connecting the TSV 508 with the control circuitry 510.

Figures 5B, 5C:
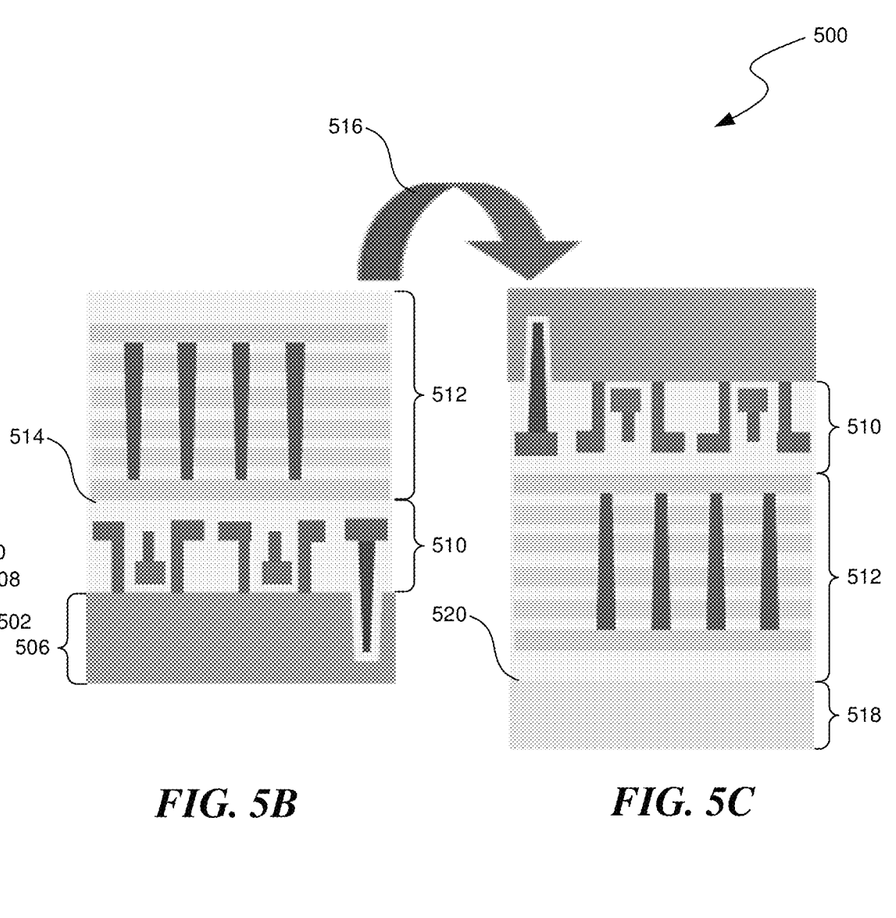

At block 406, processes 400 can form a memory array (such as memory array 306) on the memory die over the control circuitry (e.g., on the opposite side of the control circuitry from the substrate). As illustrated in FIG. 5B, memory array 512 is formed on the opposite side 514, from the substrate 506, of the control circuitry 510. In some implementations, forming the memory array can include forming a 3D NAND memory array. In some implementations, as will be readily apparent to one skilled in the art, forming a 3D NAND memory array can include forming a stack of layers of NAND memory cell structures.

At block 408, processes 400 can attach a carrier wafer on an opposite side of the memory array from the control circuitry. As illustrated by arrow 516 between FIGS. 5B and 5C, the processes 400 can include flipping the memory device over to set the memory device on the carrier wafer 518 or otherwise adjusting or using alternate manufacturing machinery to work on the back side of the memory device. In other implementations, the carrier wafer 518 can be placed on top of the memory array 512 without flipping the memory device over or changing the manufacturing machinery. As illustrated in FIG. 5C, the carrier wafer 518 is attached on the opposite side 520, from the control circuitry 510, of the memory array 512.

Figure 5D:
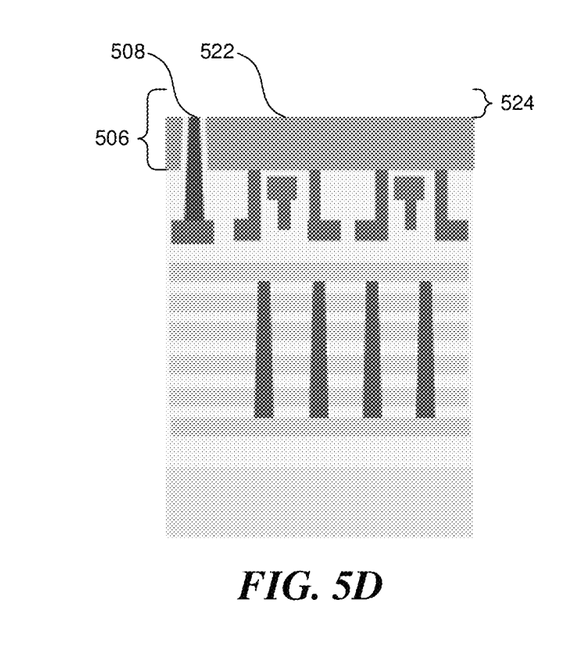

At block 410, processes 400 can expose the TSV by planarizing a backside of the substrate 506. Various processes can be used to remove portions of the substrate 506, such as using mechanical or chemical etching. As illustrated in FIG. 5D, the backside 522 of the substrate 506 is planarized to remove portion 524 (shown as removed in FIG. 5D). The width of portion 524 is sufficient to expose TSV 508 on the backside 522 of the substrate 506.

Figure 5E:
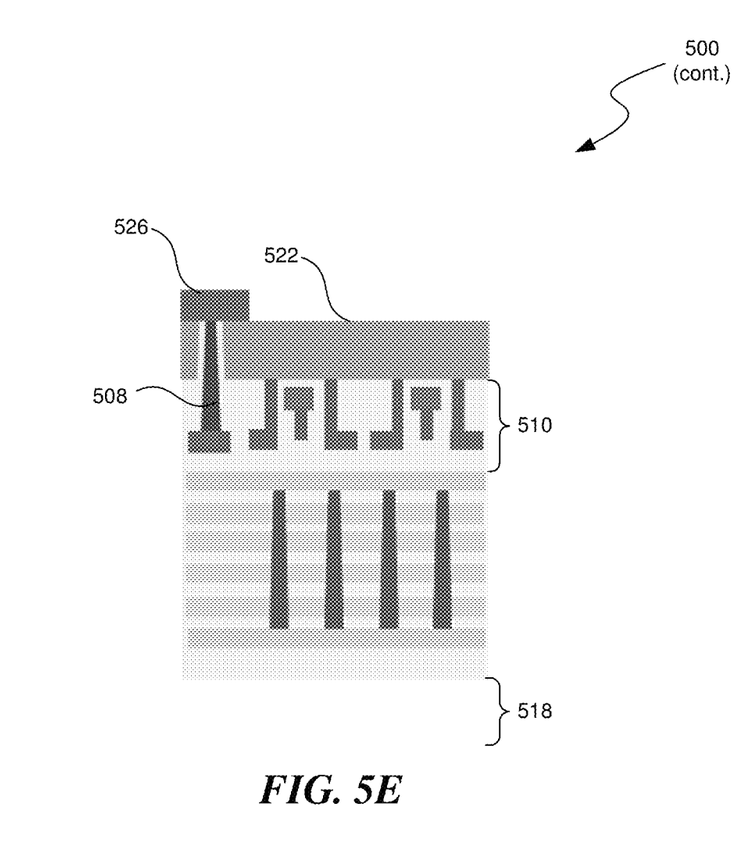

At block 412, processes 400 can form a bond pad (such as bond pad 308) with the exposed TSV on the backside of the substrate 506. As illustrated in FIG. 5E, bond pad 526 can be formed on the backside 522 of the substrate 506, connecting the bond pad 526 with the TSV 508, and through the TSV 508 to the control circuitry 510. At block 414, processes 400 can remove the carrier wafer from the memory device, (e.g. by planarizing the carrier wafer from the memory device, or removing an adhesive connecting the carrier wafer to the memory device). As further illustrated in FIG. 5E, the carrier wafer 518 has been removed from the memory device.

Figure 6:
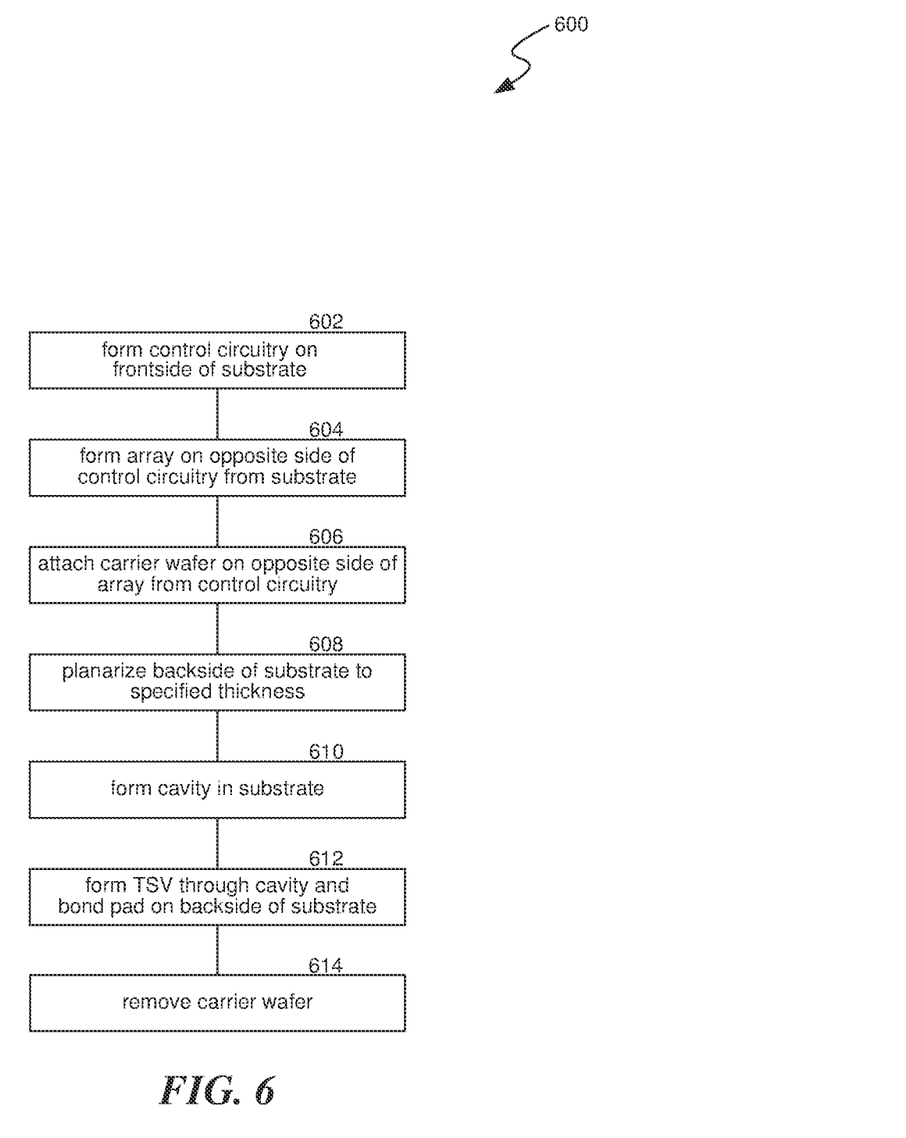
FIG. 6 is a flow diagram of another manufacturing processes for the memory die of FIG. 3, in accordance with some embodiments of the present disclosure.

FIG. 6 is a flow diagram illustrating an example of second manufacturing processes 600 for the memory die 300 in accordance with some implementations of the present technology. Although shown in a particular sequence or order, unless otherwise specified, the order of the processes 600 can be modified. Thus, the illustrated embodiments should be understood only as examples, and the illustrated processes 600 can be performed in a different order, and some of the processes 600 can be performed in parallel. Additionally, one or more of the processes 600 can be omitted in various embodiments. Thus, not all of processes 600 are required in every embodiment. Other process flows are possible. FIGS. 7A-7E are conceptual diagrams 700 illustrating the second manufacturing processes 600 of FIG. 6. While FIGS. 7A-7E show formation of a single memory device, it will be understood that in some cases many such memory devices can be formed on a single wafer before the wafer is singulated to form individual memory die.

Figure 7A:
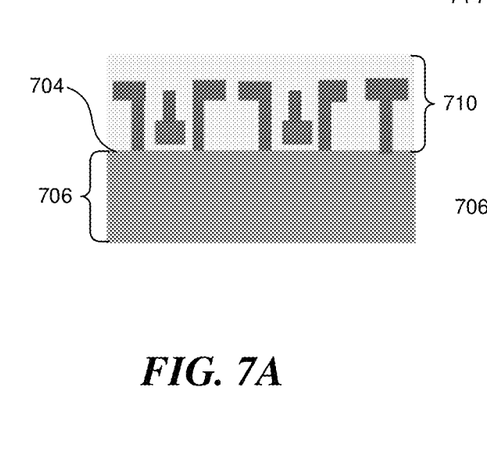
FIGS. 7A-7E are conceptual diagrams illustrating the manufacturing processes of FIG. 6.

At block 602, processes 600 can form control circuitry (such as control circuitry 304) on a frontside of a substrate. As illustrated in FIG. 7A, control circuitry 710 is formed on the frontside 704 of substrate 706.

Figure 7B:
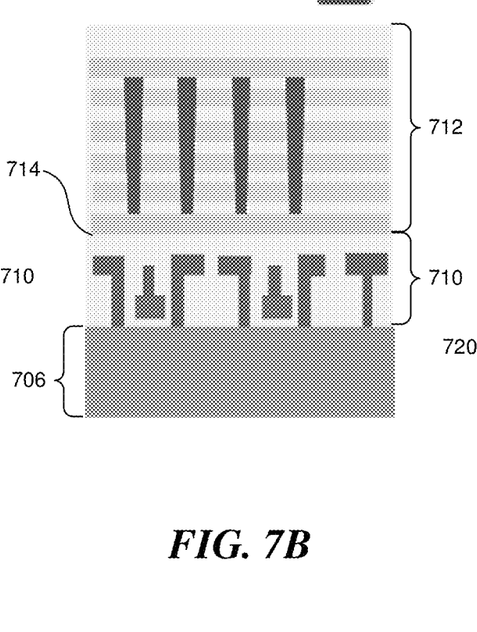

At block 604, processes 600 can form a memory array (such as memory array 306) of the memory device over the control circuitry (e.g., on the opposite side of the control circuitry from the substrate). As illustrated in FIG. 7B, memory array 712 is formed on the memory die on the opposite side 714, from the substrate 706, of the control circuitry 710.

Figure 7C:
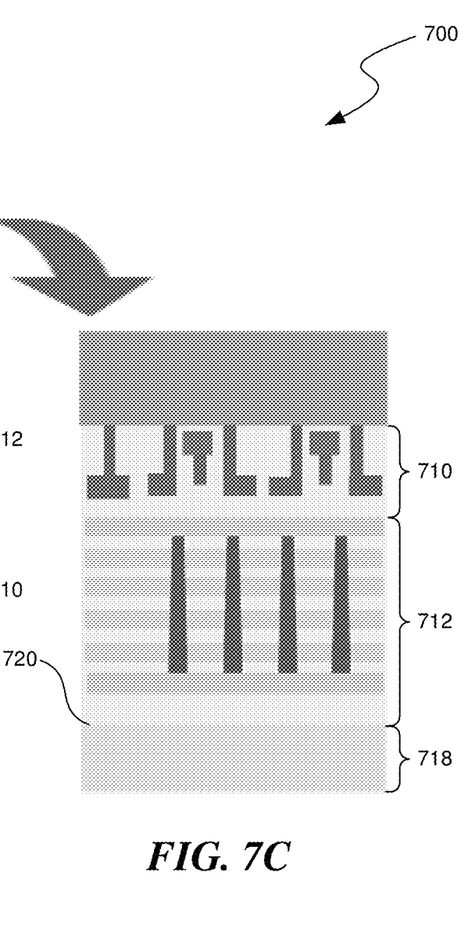

At block 606, processes 600 can attach a carrier wafer to the memory device on an opposite side of the memory array from the control circuitry. As illustrated by arrow 716 between FIGS. 7B and 7C, the processes 600 can include flipping the memory device over to set the memory device on the carrier wafer 718 or otherwise adjusting or using alternate manufacturing machinery to work on the opposite side of the memory device. In other implementations, the carrier wafer 718 can be placed on top of the memory array 712 without flipping the device over or changing the manufacturing machinery. As illustrated in FIG. 7C, the carrier wafer 718 is attached on the opposite side 720, from the control circuitry 710, of the memory array 712.

Figure 7D:
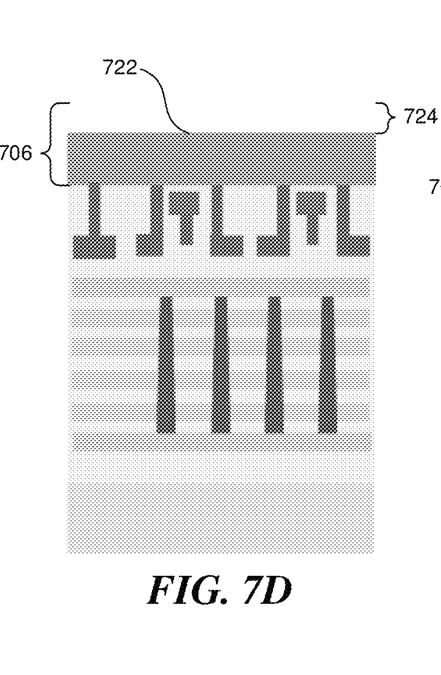

At block 608, processes 600 can planarize a backside of the substrate to a specified thickness. Various processes can be used to remove portions of the substrate, such as using mechanical or chemical etching. As illustrated in FIG. 7D, the backside 722 of the substrate 706 is planarized to remove portion 724 (shown as removed in FIG. 7D). The width of removed portion 724 is sufficient for creating a TSV through the remaining portion of the substrate 706.

Figure 7E:
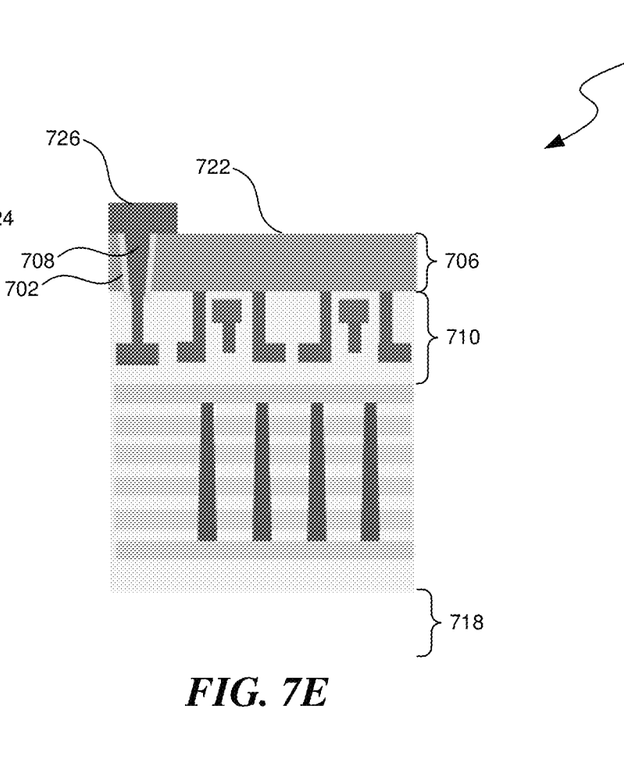

At block 610, processes 600 can form a cavity in the substrate. In various implementations, the cavity in the substrate can be created using etching or other methods of forming or removing the semiconductor material. As illustrated in FIG. 7E, a cavity 702 is formed by etching the backside 722 of the substrate 706.

At block 612, processes 600 can form a TSV (such as TSV 314) through the cavity and form a bond pad (such as bond pad 308) on the TSV on the backside of the substrate. The TSV can be formed to connect to control circuitry of the memory die. As further illustrated in FIG. 7E, a TSV 708 can be formed in the cavity 702 and a bond pad 726 can be formed on the backside 722 of the substrate 706, connecting the bond pad 726 through the TSV 708 to the control circuitry 710.

At block 614, processes 600 can remove the carrier wafer from the memory device, e.g. by planarizing the carrier wafer from the memory device. As further illustrated in FIG. 7E, the carrier wafer 718 has been planarized from the memory die (shown in FIG. 7E where the carrier wafer 718 has been removed).

In some implementations, multiple memory devices can be formed on a wafer, using the processes 400 or the processes 600, before the wafer is singulated to form multiple individual memory dies.

Although non-volatile memory components such as NAND type flash memory are described herein, the memory components can be based on any other type of memory such as a volatile memory. In some embodiments, the memory components can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense. Those skilled in the art will appreciate that the components and blocks illustrated in FIGS. 1-7 described above may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Several implementations of the disclosed technology are described above in reference to the figures. Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. An apparatus, comprising:
    a substrate with a frontside and a backside opposite the frontside;
    control circuitry disposed over the frontside of the substrate;
    a memory array disposed over and electrically coupled to the control circuitry;
    a through-silicon via (TSV) disposed under the memory array, the TSV extending through the substrate from the control circuitry to the backside of the substrate; and
    a bond pad disposed on the backside of the substrate and electrically coupled to the control circuitry via the TSV, wherein there are no bond pads on a top side of the apparatus.

2. The apparatus of claim 1, wherein the memory array comprises a negative-and (NAND) memory array.

3. The apparatus of claim 1, wherein the control circuitry comprises complementary metal-oxide-semiconductor (CMOS) circuitry.

4. The apparatus of claim 3, wherein the memory array is disposed over the CMOS control circuitry in a CMOS Under Array (CUA) configuration.

5. The apparatus of claim 1, wherein the memory array extends within a threshold distance of each edge of the substrate, the threshold distance being less than a width of the bond pad.

6. A method for manufacturing a memory die, the method comprising:
    forming a through-silicon via (TSV) in a substrate that has a frontside and a backside opposite the frontside;
    forming control circuitry on the frontside of the substrate;
    forming a memory array over the control circuitry, wherein the memory array is electrically coupled to the control circuitry;
    forming a bond pad on the backside of the substrate, wherein the bond pad is electrically coupled to the control circuitry via the TSV, and
    prior to forming the bond pad, attaching a carrier wafer to a top side of the memory die opposite the backside of the substrate.

7. The method of claim 6, further comprising singulating the memory die from a wafer.

8. The method of claim 6, further comprising removing the carrier wafer from the memory die, following forming the bond pad.

9. The method of claim 6, further comprising exposing the TSV by planarizing the backside of the substrate.

10. The method of claim 6, wherein the memory array comprises NAND memory cells.

11. The method of claim 6, wherein the control circuitry is complementary metal-oxide-semiconductor (CMOS) circuitry.

12. An apparatus, comprising:
    a bond pad formed on a backside of a substrate, wherein the substrate has a frontside opposite the backside;
    complementary metal-oxide-semiconductor (CMOS) circuitry disposed over the frontside of the substrate and under a memory array;
    wherein the bond pad is electrically coupled to the CMOS circuitry through a via that passes through the substrate to the CMOS circuitry but does not pass through a plane containing the memory array,
    wherein there are no bond pads on a top side of the apparatus.

13. The apparatus of claim 12, wherein the via is a through-silicon via (TSV).

14. The apparatus of claim 12, wherein the via is vertically aligned with memory array and does not penetrate the memory array.

15. The apparatus of claim 12,
wherein the memory array extends within a threshold distance of each edge of the substrate such that the threshold distance is smaller than a width of the bond pad; and
wherein the bond pad is vertically aligned with the memory array.

16. The apparatus of claim 12, wherein the memory array comprises a NAND memory array.

17. The apparatus of claim 12, wherein the via does not extend away from the bond pad past the CMOS.

\* \* \* \* \*